United States Patent [19]

Suenaga

[11] Patent Number: 4,559,566
[45] Date of Patent: Dec. 17, 1985

[54] FM DEMODULATING CIRCUIT HAVING AN INSENSITIVE FREQUENCY POINT

[75] Inventor: Kazuyuki Suenaga, Noda, Japan

[73] Assignee: Victor Company of Japan, Ltd., Yokohama, Japan

[21] Appl. No.: 332,882

[22] Filed: Dec. 21, 1981

[30] Foreign Application Priority Data

Dec. 22, 1980 [JP] Japan .............................. 55-181573

[51] Int. Cl.[4] .......................... H04N 5/76; G11B 3/74
[52] U.S. Cl. ...................................... 358/342; 358/23; 358/36; 358/37; 358/38; 360/29
[58] Field of Search ................... 358/196-198, 358/143-145, 341-343, 23, 24, 36-38; 329/112, 137, 140; 455/337, 214; 360/29, 30

[56] References Cited

U.S. PATENT DOCUMENTS

| 3,925,605 | 12/1975 | Rennick | 358/336 |
|---|---|---|---|
| 3,934,263 | 1/1976 | Palmer | 358/343 X |
| 3,989,893 | 11/1976 | Eisema | 358/343 |
| 3,997,797 | 12/1976 | Sahara et al. | 329/140 X |
| 4,018,987 | 4/1977 | Keizer | 358/342 |
| 4,342,000 | 7/1982 | Ogita | 455/214 X |
| 4,353,034 | 10/1982 | Kimoto | 329/137 X |
| 4,356,510 | 10/1982 | Nakayama | 358/198 X |
| 4,359,694 | 11/1982 | Suenaga | 455/214 X |
| 4,393,489 | 7/1983 | Mehrotra | 358/343 |

FOREIGN PATENT DOCUMENTS

| 2145332 | 9/1971 | Fed. Rep. of Germany | 369/86 |
|---|---|---|---|
| 0053979 | 4/1980 | Japan | 358/198 |
| 0162607 | 12/1980 | Japan | 329/112 |

OTHER PUBLICATIONS

IEEE Transactions on Consumer Electronics, vol. CE-27, No. 3, Aug. 1981, pp. 361-365; "TV Multichannel Sound-Savior or a New Sacred Cow?".

IEEE Transactions on Consumer Electronics, vol. CE-27, No. 3, Aug. 1981, "New IC for Sound Multiplex Decoder".

Primary Examiner—Raymond F. Cardillo, Jr.
Assistant Examiner—Alan K. Aldous
Attorney, Agent, or Firm—Louis Bernat

[57] ABSTRACT

An FM demodulating circuit demodulates a frequency-modulated signal of a predetermined channel of frequency-modulated signals of respectively different channels, where the frequency-modulated signals are obtained by frequency-modulating carriers of respectively different frequencies by information signals of respectively different channels and transmitting the frequency-modulated signals in a mutually multiplexed state. The FM demodulating circuit has a demodulated output characteristic such that a frequency at which a differential value describing the slope of a demodulated output characteristic curve becomes maximum, is substantially equal to a center frequency of the frequency-modulated signal of the above predetermined channel, and a frequency at which the differential value becomes minimum is equal to a center frequency of a frequency-modulated signal of a channel other than the above predetermined channel.

6 Claims, 9 Drawing Figures

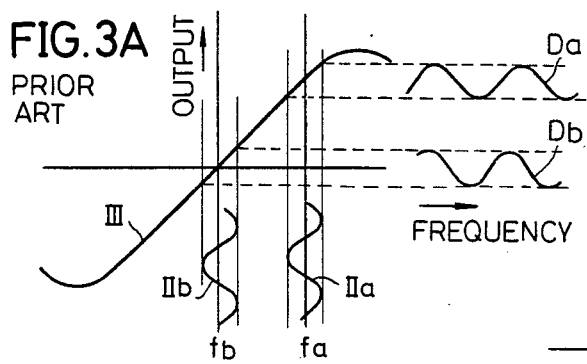
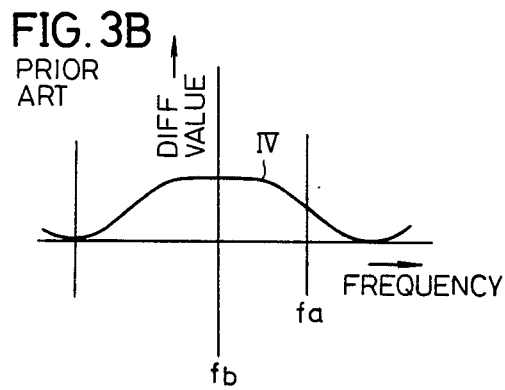
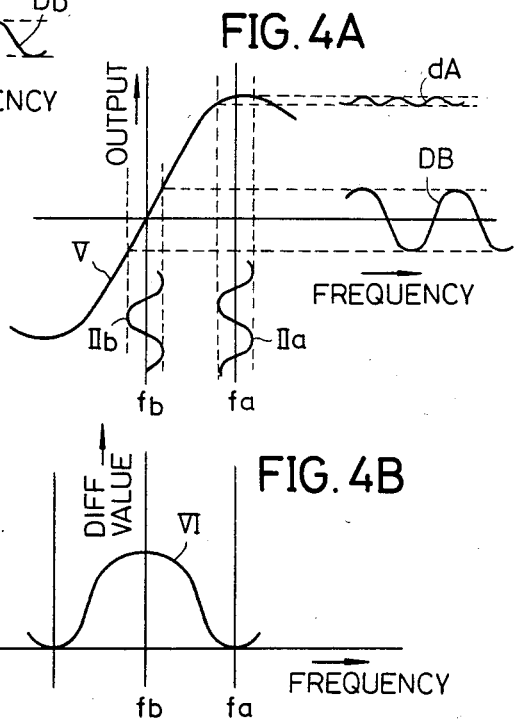
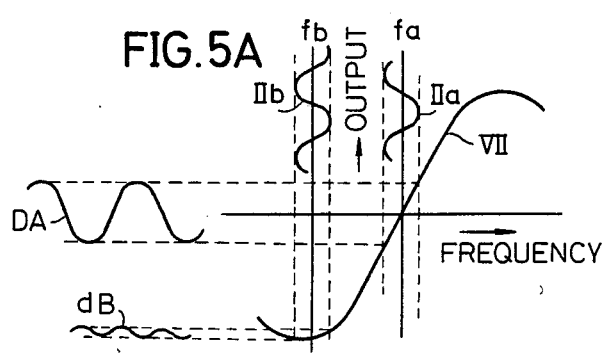
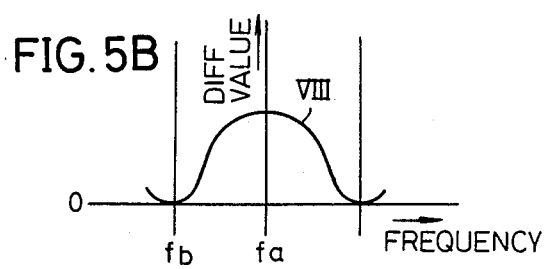

FM DEMODULATING CIRCUIT HAVING AN INSENSITIVE FREQUENCY POINT

BACKGROUND OF THE INVENTION

The present invention generally relates to FM demodulating circuits, and more particularly to an FM demodulating circuit capable of finely demodulating an FM signal of each channel in FM signals of a plurality of channels, without introducing mixing of signals of other channels as crosstalk.

Conventionally, apparatuses are being realized for reproducing a rotary recording medium recorded with a plurality of channels of FM audio signals such as a two-channel stereo signal, by multiplexing the FM audio signals with a video signal. In this system, since the band in which the rotary recording medium can be reproduced is narrow, the FM signals of channels are recorded in a state where center frequencies of the FM signals are quite close to each other.

Hence, in the conventional FM demodulating circuit, when an FM signal of a desired channel is demodulated, an FM signal of another channel adjacent to the above channel are also demodulated. Therefore, there was a disadvantage in that these signals from other channels were obtained as crosstalk components.

SUMMARY OF THE INVENTION

Accordingly, it is a general object of the present invention to provide a novel and useful FM signal demodulating circuit in which the above described disadvantages have been overcome.

Another and more specific object of the present invention is to provide an FM signal demodulating circuit capable of finely demodulating an FM signal of one channel in FM signals of a plurality of channels, without introducing mixing of signals of other channels as crosstalk. According to the FM signal demodulating circuit of the present invention, the demodulating characteristic is set so that the frequency at the maximum sloping part of the demodulating characteristic coincides with the center frequency of the FM signal of the channel which is to be demodulated, and the frequencies at which the slope of the demodulating characteristic becomes zero coincide with center frequencies of FM signals of other channels.

Other objects and further features of the present invention will be apparent from the following detailed description when read in conjunction with the accompanying drawings.

BRIEF DESCRIPTION OF THE DRAWINGS

FIGS. 3A and 3B are diagrams respectively showing a demodulated output characteristic and a differentiation characteristic of an example of a conventional FM demodulating circuit;

FIGS. 4A and 4B are diagrams respectively showing a demodulated output characteristic and a differentiation characteristic with respect to an FM signal of one channel, of an embodiment of an FM demodulating circuit according to the present invention;

FIGS. 5A and 5B are diagrams respectively showing a demodulated output characteristic and a differentiation characteristic with respect to FM signals of other channels, of the embodiment of the FM demodulating circuit according to the present invention.

DETAILED DESCRIPTION

Figure 1:
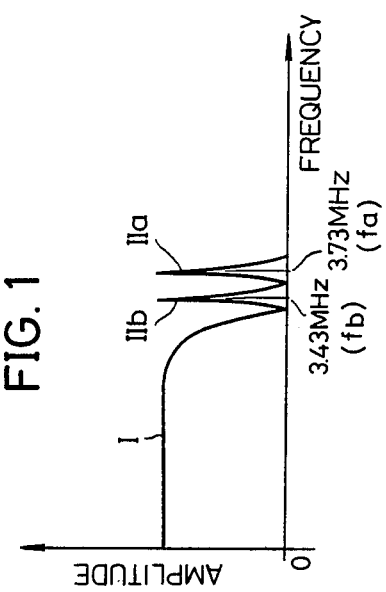
FIG. 1 is a diagram showing frequency spectrums of a video signal and audio signals recorded in a rotary recording medium.

As indicated in FIG. 1, a rotary recording medium (hereinafter simply referred to as a disc) 10 is recorded with a video signal I, a first audio FM signal IIa obtained by frequency-modulating a carrier of 3.73 MHz by an audio signal of a first channel, and a second audio FM signal IIb obtained by frequency-modulating a carrier of 3.43 MHz by an audio signal of a second channel. The above signals are recorded on the disc 10 in a multiplexed state. A carrier of 7 MHz, for example, is frequency-modulated by the above multiplexed signals as a whole, and the frequency-modulated (FM) signal is recorded on a main track. Reference signals for tracking control are recorded between adjacent main track turns.

Figure 2:
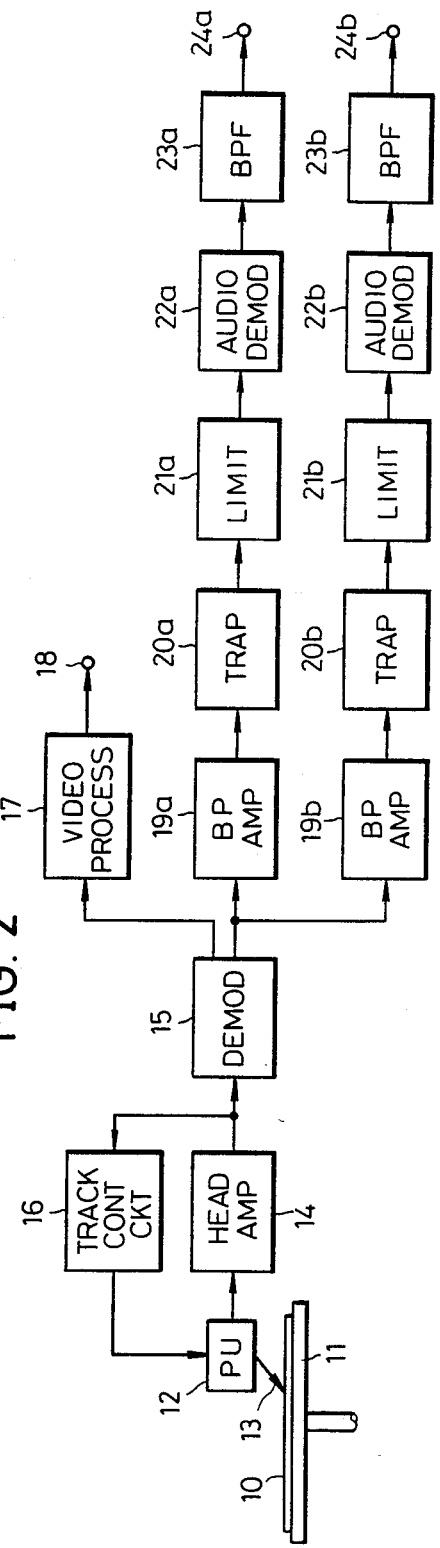
FIG. 2 is a systematic block diagram showing an example of a rotary recording medium reproducing apparatus to which an FM signal demodulating circuit according to the present invention can be applied.

In FIG. 2, the disc 10 recorded with the above signals is rotated by a turntable 11, and a recorded signal is reproduced by a reproducing stylus 13 of a signal pickup device 12. The signal picked up and reproduced by the signal pickup device 12 is supplied to a video signal FM demodulating circuit 15 and a tracking control circuit 16, through a head amplifier 14. The reference signals within the reproduced signal are discriminated at the tracking control circuit 16, to form a tracking control signal. This tracking control signal is supplied to the signal pickup device 12, and thus, tracking control is performed so that the reproducing stylus 13 accurately scans over the main track.

The reproduced FM signal is demodulated at the FM demodulating circuit 15, and the video signal I is obtained through an output terminal 18 after being subjected to signal processing at a video signal processing circuit 17. Moreover, the audio FM signals IIa and IIb of the first and second channels which are obtained from the FM demodulating circuit 15, are supplied to bandpass amplifiers 19a and 19b. The bandpass amplifier 19a is an amplifier having a filtering band characteristic in the band of the audio FM signal IIa, and passes the audio FM signal IIa. Similarly, the bandpass amplifier 19b is an amplifier having a filtering band characteristic in the band of the audio FM signal IIb, and passes the audio FM signal IIb.

Output signals of the bandpass amplifiers 19a and 19b are respectively supplied to trap circuits 20a and 20b. When center frequencies (that is, carrier frequencies upon non-modulation) of the audio FM signals IIa and IIb are respectively designated by fa and fb, the trap circuits 20a and 20b have trap characteristics with centers at the frequencies fb and fa, respectively. Accordingly, the audio FM signals IIb and IIa of mutually other channels which are respectively mixed into the output signals IIa and IIb of the bandpass amplifiers 19a and 19b, are respectively trapped and eliminated at the trap circuits 20a and 20b.

The output signals IIa and IIb obtained from the trap circuits 20a and 20b are respectively supplied to limiters 21a and 21b wherein the signals are amplified and limited, and then supplied to audio signal FM demodulating circuit 22a and 22b. The audio signals of the first and second channels which are demodulated at the audio signal FM demodulating circuits 22a and 22b, are eliminated of unwanted components at bandpass filters 23a and 23b, respectively, and then obtained through output terminals 24a and 24b.

However, the above bandpass amplifiers 19a and 19b respectively cannot completely filter only the audio FM signals IIa and IIb of these channels, and the audio FM signals IIb and IIa of the other channels are slightly mixed thereto. Hence, if the effects of the trap circuits 20a and 20b and the limiters 21a and 21b are not sufficient, the audio FM signals IIb and IIa of the other channels are mixed into and exist within the audio FM signals IIa and IIb of the first and second channels. Moreover, since the trap circuits 20a and 20b and the limiters 21a and 21b are generally not completely linear circuits, the above audio FM signals IIa and IIb receive non-linear distortion when passing through these circuits. Accordingly, with respect to the center frequencies, signals having frequencies fa, fb, (fa+fb), and (fa−fb) are present in the signals supplied to the audio signal FM demodulating circuits 22a and 22b.

In the case where the frequencies fa and fb are respectively equal to 3.73 MHz and 3.43 MHz as described above, (fa+fb)=7.16 MHz and (fa−fb)=300 kHz. The frequency (fa+fb)=7.16 MHz is a high frequency outside the demodulating bands of the audio FM demodulating circuits 22a and 22b, and is not FM demodulated. On the other hand, the frequency (fa−fb)=300 kHz is demodulated at the audio FM demodulating circuits 22a and 22b, but eliminated at the bandpass filters 23a and 23b. Hence, the signals having the frequencies (fa+fb) and (fa−fb) substantially do not give rise to problems. However, the signal having the frequency fb which is mixed into the first channel system, and the signal having the frequency of fa which is mixed into the second channel system respectively cannot be eliminated.

Accordingly, a conveivable audio signal FM demodulating circuit has a curved demodulated output characteristic (so-called S-curve characteristic) as indicated in FIG. 3A. FIG. 3A indicates a demodulated output characteristic III of the FM demodulating circuit with respect to the audio FM signal IIb of the second channel. A differentiation characteristic IV describing the slope of the above demodulated output characteristic III is indicated in FIG. 3B. As clearly seen from FIGS. 3A and 3B, the signal IIb having the center frequency fb corresponds to the maximum sloping part of the demodulated output characteristic, however, the signal IIa having the center frequency fa also corresponds to the sloping part of the demodulated output characteristic. Thus, the signal IIb having the center frequency fb which should actually be demodulated is obtained as an output Db, however, the signal IIa having the center frequency fa is also demodulated and obtained as an output Da. Therefore, there was a disadvantage in that, besides the demodulated output Db which should originally be obtained, the demodulated output Da is mixed into the output of the FM demodulating circuit as a large crosstalk component. This crosstalk component cannot be eliminated at a filter provided in a succeeding stage.

Accordingly, in the FM demodulating circuit according to the present invention, the demodulating characteristic is selected in a manner described hereinafter.

The audio signal FM demodulating circuit 22b has a demodulating output characteristic V indicated in FIG. 4A. A differential characteristic VI describing the slope of the demodulating characteristic V is indicated in FIG. 4B. The center (maximum sloping part) of the demodulating characteristic V indicated in FIG. 4A, that is, the frequency at which the differential value of the differentiation characteristic VI indicated in FIG. 4B becomes maximum, is selected so as to become equal to the center frequency fb of the signal IIb. Furthermore, substantially the center point (vertex point) of the curved part in the demodulated output characteristic V indicated in FIG. 4A, that is, the frequency at which the differential value of the differentiation characteristic VI indicated in FIG. 4B becomes substantially minimum (zero), is selected so as to become equal to the center frequency fa of the signal IIa.

Accordingly, the signal IIb of the channel which should originally be demodulated at the FM demodulating circuit 22b, is demodulated and obtained as a demodulated output DB having a large amplitude. On the other hand, the signal IIa of the other channel is demodulated and obtained as a demodulated output dA having an exceedingly small amplitude. The level of the above demodulated output dA is of a level which can be neglected practically, and the effect of crosstalk can accordingly be neglected practically.

According to the circuit of the present invention, the frequency at the center point of the curve in the demodulated output characteristic V can be selected to a frequency equal to the frequency fa which is close to the frequency fb, as described above. Hence, the slope at the center part of the demodulated output characteristic V becomes steep compared to the slope at the center part of the conceivable demodulated output characteristic III indicated in FIG. 3A. Accordingly, the demodulated output DB of the signal IIb can be obtained with a larger amplitude.

The audio signal FM demodulating circuit 22a similarly has a demodulated output characteristic VII indicated in FIG. 5A. A differentiation characteristic VIII describing the slope of the demodulated output characteristic VII is indicated in FIG. 5B. The center (maximum sloping part) of the demodulated output characteristic VII indicated in FIG. 5A, that is, the frequency at which the differential value of the differentiation characteristic VIII indicated in FIG. 5B becomes maximum, is selected so as to become equal to the center frequency fa of the signal IIa. Moreover, substantially the center point (vertex point) of the curved part in the demodulated output characteristic VII indicated in FIG. 5A, that is, the frequency at which the differential value of the differentiation characteristic VIII indicated in FIG. 5B becomes substantially minimum (zero), is selected so as to become equal to the center frequency fb of the signal IIb.

Accordingly, the signal IIa of the channel which should originally be demodulated at the FM demodulating circuit 22a, is demodulated and obtained as a demodulated output DA having a large amplitude. On the other hand, the signal IIb of the other channel is demodulated and obtained as a demodulated output dB having an exceedingly small amplitude. The level of the above demodulated output dB is of a level which can be neglected practically, and the effect of crosstalk can accordingly be neglected practically.

Figure 6:
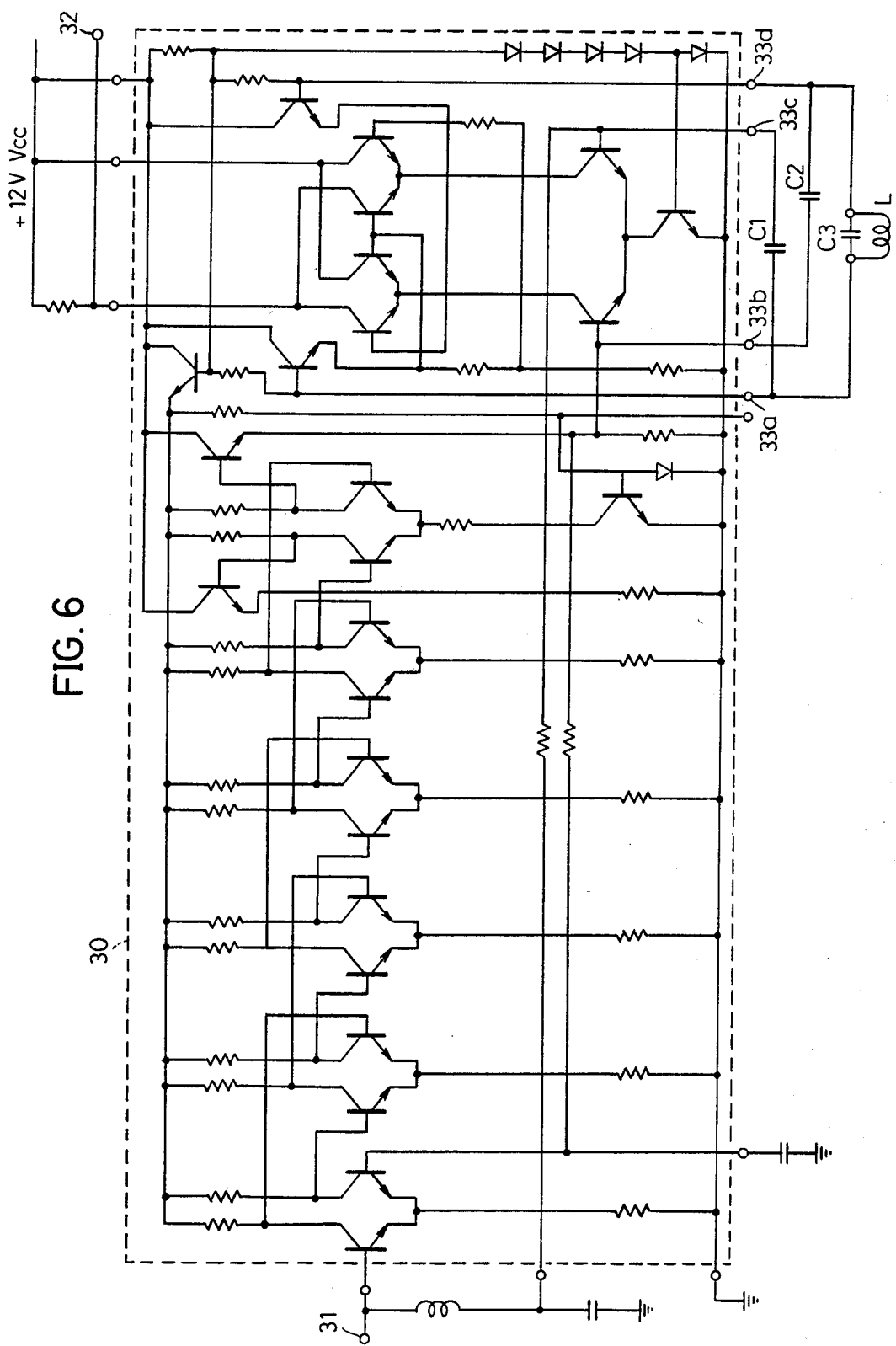
FIG. 6 is a concrete circuit diagram showing an embodiment of the FM signal demodulating circuit according to the present invention.

Next, a circuit diagram of an embodiment of a concrete circuit of an FM demodulating circuit which is constructed so as to have the above described demodulating characteristic, is shown in FIG. 6. In FIG. 6, a circuit 30 indicated by a dotted line surrounding a circuit part, includes the limiter 21a (21b) and the audio signal FM demodulating circuit 22a (22b), and is in the form of an integrated circuit having a known construction. The reproduced FM signal from the trap circuit 20a (20b) is supplied to a terminal 31. A demodulated output is obtained through a terminal 32. In the above circuit 30, a capacitor C1 is connected between terminals 33a and 33c, and a capacitor C2 is connected between terminals 33b and 33d, at the FM demodulating circuit stage of the circuit 30. In addition, a parallel connection circuit consisting of a capacitor C3 and a coil L, is connected between the terminals 33a and 33d.

Constants of the above circuit elements as selected as follows, for example.

Capacitances of the capacitors: C1=C2=15 pF, C3=100 pF

Inductance of the coil: L÷10 μH

In a case where the demodulated output characteristic indicated in FIG. 4A is given to the circuit shown in FIG. 6 and the circuit in FIG. 6 is used as the FM demodulating circuit 22b, the position of the core in the coil L is adjusted to set the inductance of the coil L to a value slightly larger than 10 μH. In a case where the demodulated output characteristic indicated in FIG. 5A is given to the circuit shown in FIG. 6 and the circuit in FIG. 6 is used as the FM demodulating circuit 22a, the position of the core in the coil L is adjusted to set the inductance of the coil L to a value slightly smaller than 10 μH.

Further, the present invention is not limited to these embodiments, but various variations and modifications may be made without departing from the scope of the present invention.

What is claimed is:

1. An FM demodulating circuit for demodulating a plurality of frequency modulated signals, said FM demodulating circuit comprising:

input means for receiving at least first and second frequency modulated signals, said first and second frequency modulated signals being independent from each other;

a first demodulator circuit coupled to said input means for demodulating first predetermined signals from said input means, said first predetermined signals including said first frequency modulated signal and said second frequency modulated signal appearing as a first crosstalk component in said first frequency modulated signal, said first frequency modulated signal being demodulated in said first demodulator circuit; and output terminal means coupled to an output of said first demodulator circuit for producing a demodulated output of said first demodulator circuit;

said first demodulator circuit comprising first circuit meand coupled to said input means, first capacitor means coupled to said circuit means, and first inductor means coupled to said circuit means and said capacitor means, said first capacitor means and said first inductor means including a parallel-connected circuit comprising a capacitor and a coil, said first demodulator circuit having a first demodulating output frequency characteristic in which a first differential value describing the slope of the first demodulating output frequency characteristic curve reaches a maximum at a frequency which is approximately equal to a center frequency of said first frequency modulated signal and reaches a minimum at a frequency which is approximately equal to a center frequency of said second frequency modulated signal, so that the amplitude of the demodulated output of said first crosstalk component is negligible as compared to the amplitude of the demodulated output of said first frequency modulated signal.

2. An FM demodulating circuit as claimed in claim 1 which further comprises a second demodulator circuit coupled to said input means for demodulating second predetermined signals from said input means, said second predetermined signals including said second frequency modulated signal with said first frequency modulated signal appearing as a second crosstalk component, said first frequency modluated signal being a signal which is an undesirable one with respect to the demodulation in said second demodulator circuit, said output terminal means also being coupled to an output of said second demodulator circuit for producing output demodulated signals of said second demodulator circuit, said second demodulator circuit comprising second circuit means coupled to said input means, second capacitor means coupled to said circuit means, and second inductor means coupled to said circuit means and said capacitor means, said second capacitor means and said second inductor means including a parallel-connected circuit comprising a capacitor and a coil, and said second demodulator circuit having a second demodulating output frequency characteristic in which a second differential value describing the slope of the second demodulating output frequency characteristic curve reaches a maximum at a frequency which is approximately equal to the center frequency of said second frequency modulated signal and reaches a minimum at a frequency which is approximately equal to the center frequency of said first frequency modulated signal, so that the amplitude of the demodulated output of said second crosstalk component is negligible as compared to the amplitude of the demodulated output of said second frequency modulated signal.

3. An FM demodulating circuit as claimed in claim 1 in which said input means receives signals from reproducing means which reproduce signals from a recording medium having a pre-recorded plurality of audio signal channels and a video signal, said plurality of audio signal channels being frequency modulated signals obtained by frequency-modulating carriers by said audio signals of different channels, said carriers having mutually different frequencies which are relatively close to each other and which exist in a frequency range which is higher than a frequency band of said video signal.

4. An FM demodulating circuit as claimed in claim 3 in which said first frequency modulated signal is obtained by frequency-modulating a first carrier by an audio signal of a first channel, said second frequency modulated signal is obtained by frequency-modulating a second carrier by an audio signal of a second channel, and said first carrier has a frequency which is greater than the frequency of said second carrier.

5. An FM demodulating circuit as claimed in claim 2 in which said first and second demodulator circuits have the same circuit construction, and said first and second demodulating output frequency characteristics of said first and second demodulator circuits being set by variably adjusting the inductance of said coils in the parallel-connected circuits of said first and second inductance means.

6. An FM demodulating circuit as claimed in claim 1 in which said first and second frequency modulated signals respectively have center frequencies of 3.73 MHz and 3.43 MHz.

* * * * *